(12) United States Patent
Tian et al.

(10) Patent No.: US 11,164,849 B2
(45) Date of Patent: Nov. 2, 2021

(54) CHIP ASSEMBLY AND CHIP

(71) Applicant: CHANGXIN MEMORY TECHNOLOGIES, INC., Hefei (CN)

(72) Inventors: Kai Tian, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/196,926

(22) Filed: Mar. 9, 2021

(65) Prior Publication Data
US 2021/0265316 A1      Aug. 26, 2021

Related U.S. Application Data

(63) Continuation of application No. PCT/CN2020/107430, filed on Aug. 6, 2020.

(30) Foreign Application Priority Data

Nov. 26, 2019   (CN) .......................... 201911176109.X (51) Int. Cl.
*H01L 23/528* (2006.01)
*H01L 25/065* (2006.01)
*H01L 23/00* (2006.01)

(52) U.S. Cl.
CPC ...... *H01L 25/0657* (2013.01); *H01L 23/5286* (2013.01); *H01L 24/06* (2013.01); *H01L 25/0652* (2013.01); *H01L 2224/06165* (2013.01); *H01L 2225/0651* (2013.01); *H01L 2225/06562* (2013.01); *H01L 2924/1436* (2013.01)

(58) Field of Classification Search
CPC ..................................................... H01L 23/528
See application file for complete search history.

(56) References Cited

U.S. PATENT DOCUMENTS

| | | | |
|---|---|---|---|
| 6,198,650 B1 * | 3/2001 | Suh ........................ | G11C 5/025 365/63 |
| 2004/0026794 A1 | 2/2004 | Tao et al. | |
| 2017/0011976 A1 | 1/2017 | Park et al. | |

FOREIGN PATENT DOCUMENTS

| CN | 102437147 A | 5/2012 |
|---|---|---|
| CN | 206532776 U | 9/2017 |
| CN | 108962881 A | 12/2018 |
| CN | 210640244 U | 5/2020 |

* cited by examiner

*Primary Examiner* — William A Harriston
(74) *Attorney, Agent, or Firm* — Kilpatrick Townsend & Stockton LLP (57) ABSTRACT

Embodiments provide a chip assembly and a chip. The chip assembly includes a substrate, a first chip and a second chip stacked on an upper surface of the substrate, and the first chip is arranged above the second chip. At edges of first sides of the first chip and the second chip there is provided with a first pad pair, and at edges of second sides of the first chip and the second chip there is provided with a second pad pair. The second pad pair is arranged between two adjacent functional units at an outermost side of the edge of the second side of the first chip or the second chip, and a lower edge of the second pad pair is not lower than lower edges of the two adjacent functional units.

14 Claims, 7 Drawing Sheets

-Prior Art-

FIG. 4

-Prior Art-

| | |
|---|---|
| TOP | |
| 1 | VDD2 |
| 2 | VSS |
| 3 | VDD1 |
| 4 | VDD2 |
| 5 | VSS |
| 6 | VSSQ |
| 7 | DQ8 |
| 8 | VDDQ |
| 9 | DQ9 |
| 10 | VSSQ |
| 11 | DQ10 |
| 12 | VDDQ |
| 13 | DQ11 |
| 14 | VSSQ |
| 15 | DQS1_t |
| 16 | DQS1_c |
| 17 | VDDQ |
| 18 | DMI1 |
| 18A | VDD2 |
| 19 | VSSQ |
| 20 | DQ12 |
| 21 | VDDQ |
| 22 | DQ13 |
| 23 | VSSQ |
| 24 | DQ14 |
| 25 | VDDQ |
| 26 | DQ15 |
| 27 | VSSQ |
| 28 | ZQ |
| 29 | VDDQ |
| 30 | VDD2 |
| 31 | RESET_n |
| 32 | VDD1 |
| 33 | VSS |
| 34 | CA5 |
| 35 | CA4 |
| 36 | VDD2 |
| 37 | CA3 |
| 38 | CA2 |
| 38A | VDD2 |
| 39 | VSS |
| 40 | CK_c |
| 41 | CK_t |
| 42 | VDD2 |
| 43 | CKE |
| 44 | CS |
| 45 | VSS |
| 46 | CA1 |
| 47 | CA0 |
| 48 | VDD2 |
| 49 | ODT(ca) |
| 50 | VSS |
| 51 | VDD1 |
| 52 | VSSQ |
| 53 | DQ7 |
| 54 | VDDQ |
| 55 | DQ6 |
| 56 | VSSQ |
| 57 | DQ5 |
| 58 | VDDQ |
| 59 | DQ4 |
| 60 | VSSQ |
| 60B | VDD2 |
| 61 | DMI0 |
| 62 | VDDQ |
| 63 | DQS0_c |
| 64 | DQS0_t |
| 65 | VSSQ |
| 66 | DQ3 |
| 67 | VDDQ |
| 68 | DQ2 |
| 69 | VSSQ |
| 70 | DQ1 |
| 71 | VDDQ |
| 72 | DQ0 |
| 73 | VSSQ |
| 74 | VSS |
| 75 | VDD2 |
| 76 | VDD1 |
| 77 | VSS |
| 78 | VDD2 |
| BOTTOM | |

CHIP ASSEMBLY AND CHIP

CROSS REFERENCE

The present disclosure is a continuation of PCT/CN2020/107430, filed on Aug. 6, 2020, which claims priority to Chinese Patent Application No. 201911176109.X, titled "CHIP ASSEMBLY AND CHIP" and filed on Nov. 26, 2019, the entire contents of which are incorporated herein by reference as a part of the present disclosure.

TECHNICAL FIELD

The present disclosure relates to the field of semiconductor technologies, and more particularly, to a chip assembly and a chip.

BACKGROUND

At present, a low-power dynamic random-access memory (DRAM) generally has nearly a hundred or more pads, including data input/output ports, command address ports, clock ports, and multiple sets of power source/ground ports. As a constituent part of distributed power supply, the multiple sets of power source/ground ports can increase power supply balance and consistency of the power source/ground. Pad layouts of a chip generally have the following types.

Figure 1:
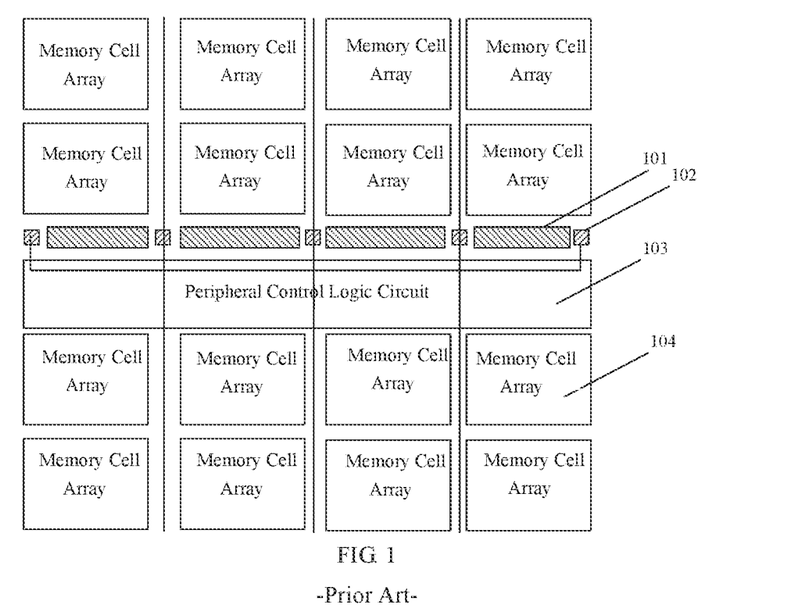
FIG. 1 schematically illustrates a schematic diagram of a chip layout in the related technologies.

As shown in FIG. 1, by placing the pads and a peripheral logic control circuit 103 in the middle of the chip, i.e., between memory cell arrays 104, a distance from power source/ground pads to two edges of the chip is only half of a height of the chip, a parasitic resistance will be reduced by half, and a voltage drop on a power source/ground cable will be reduced by half under the conditions of the same width of the power source/ground cable and the same current. In this way, noise can be reduced, and drive capability can be increased, which is particularly advantageous to a high-frequency operating mode of the chip. However, this method is not advantageous to large-capacity stacked package. To implement the stacked package, it is required to introduce a re-distribution layer (RDL) to lead the middle pads to a side of the chip, which increases the complexity of processes and increases fabrication costs. Furthermore, the parasitic resistance generated by the introduced RDL may also weaken the advantages of low resistance obtained by placing the pads in the middle of the chip.

Figure 2:
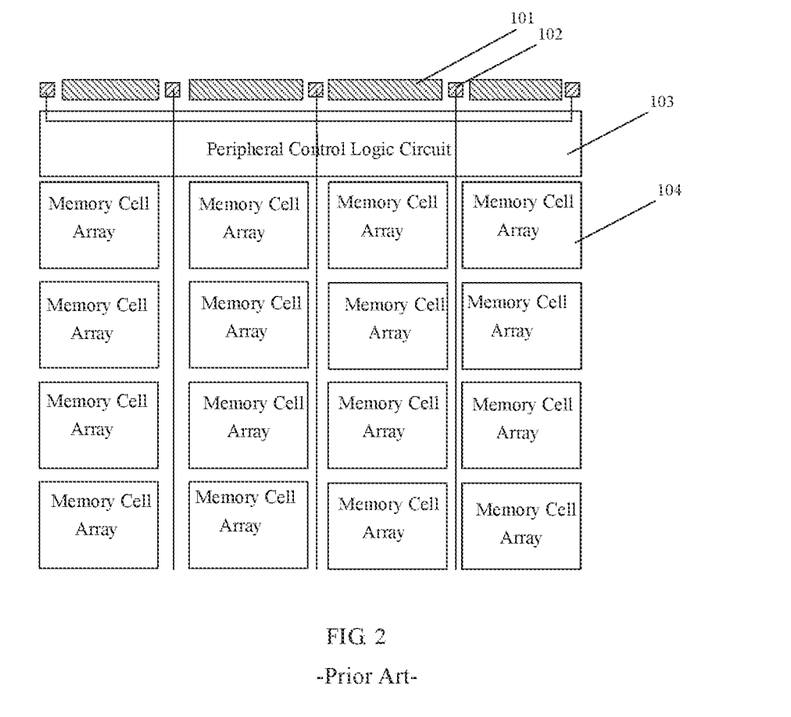
FIG. 2 schematically illustrates a schematic diagram of another chip layout in the related technologies.

As shown in FIG. 2, the pads and the peripheral control logic circuit are arranged on a certain side of the chip, especially on a shorter side. In this case, the power source/ground cable is the longest, the parasitic resistance is the largest, and the voltage drop is the largest at a far end of the chip away from the pads, which may cause the performance of the chip at the far end to be much worse than the performance of the chip at a near end, especially in the high-frequency operating mode. To ensure the chip to operate properly at the far end, the required power source/ground cable has to be widened, which takes up the space of other signal lines and increases difficulties in layout design.

Figure 3:
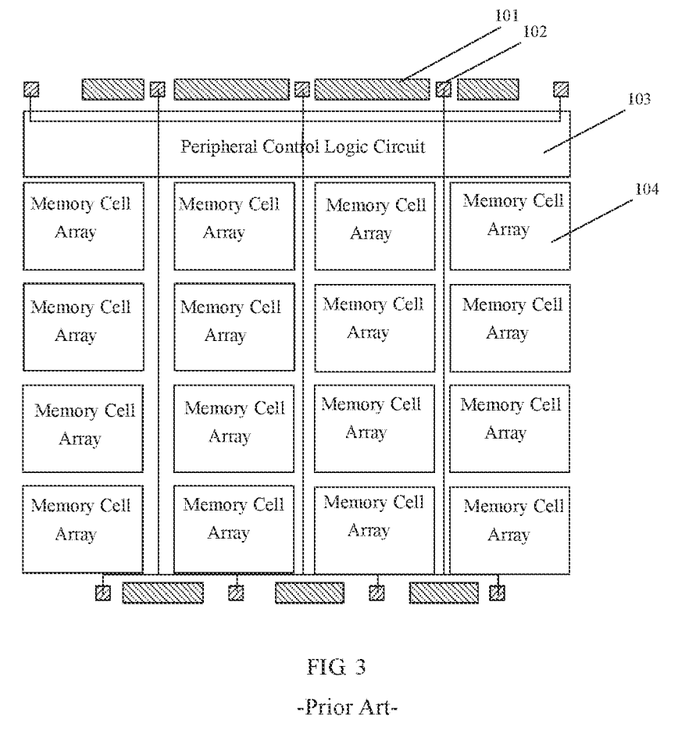
FIG. 3 schematically illustrates a schematic diagram of still another chip layout in the related technologies.

As shown in FIG. 3, the peripheral control logic circuit and a part of the pads are arranged on one side of the chip, and another part of the pads are arranged on the other side of the chip. The pads include distributed power source/ground pads 102 and other signal pads 101. In this way, the equivalent resistance and the cable area of the power source/ground cable can also be reduced. However, the increase of the area of a row of pads directly increases the fabrication costs of the chip. Furthermore, the layout of the pads on two sides may have adverse effects on the large-capacity and miniaturized package of the chip.

Figure 4:
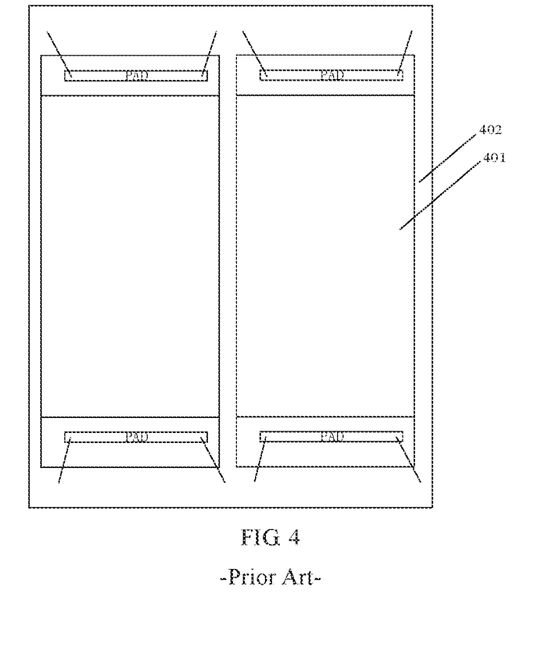
FIG. 4 schematically illustrates a vertical view of still another chip layout in the related technologies.
Figure 5:
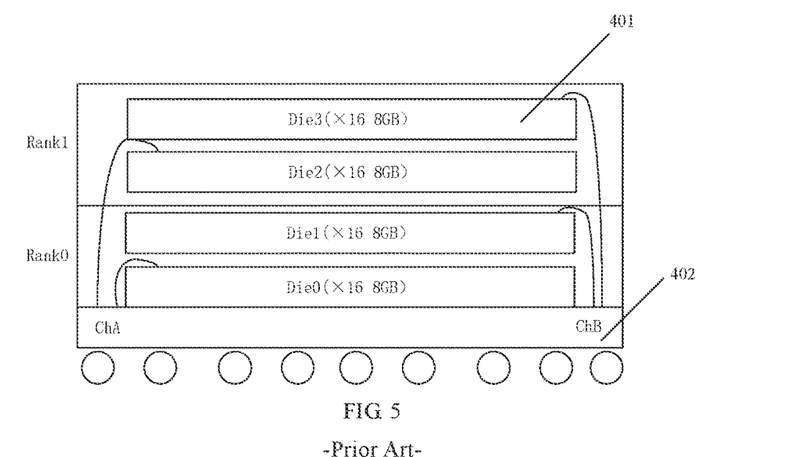
FIG. 5 schematically illustrates a sectional view of still another chip layout in the related technologies.

At present, the package of the low-power DRAM tends to large capacity and miniaturization. That is, it is expected that a large number of low-power DRAM particles can be packaged in one package cavity to increase the capacity and reduce the power consumption. This requires that the DRAM chips can support a stacked package. Under the premise of not considering the expensive Through Silicon Via (TSV) technology, in the stacked package as shown in FIG. 4 and FIG. 5, a chip 401 is arranged on a substrate 402, and the stacked package cannot be achieved unless the pads are arranged at the edge of the chip.

Figure 6:
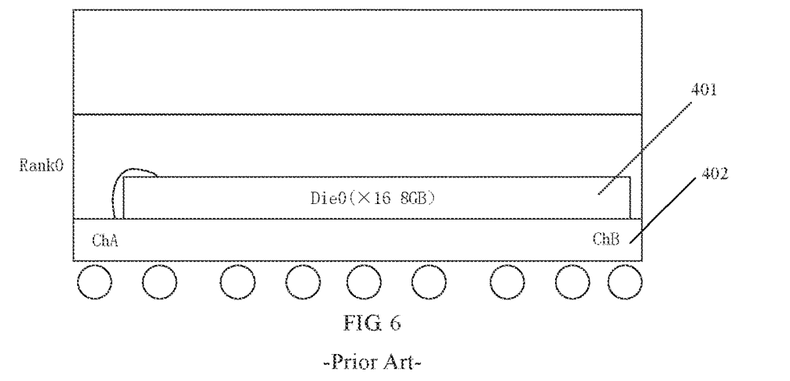
FIG. 6 schematically illustrates a sectional view of still another chip layout in the related technologies.
Figure 7:
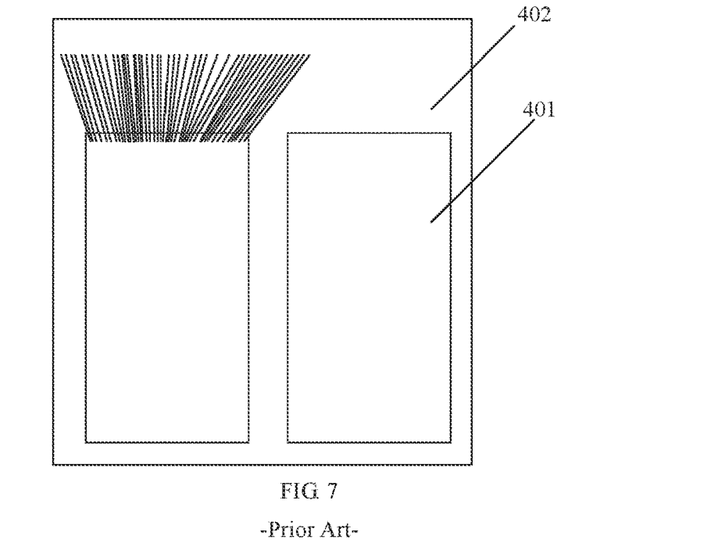
FIG. 7 schematically illustrates a schematic diagram of connection between a chip and a substrate in the related technologies.
Figure 8:
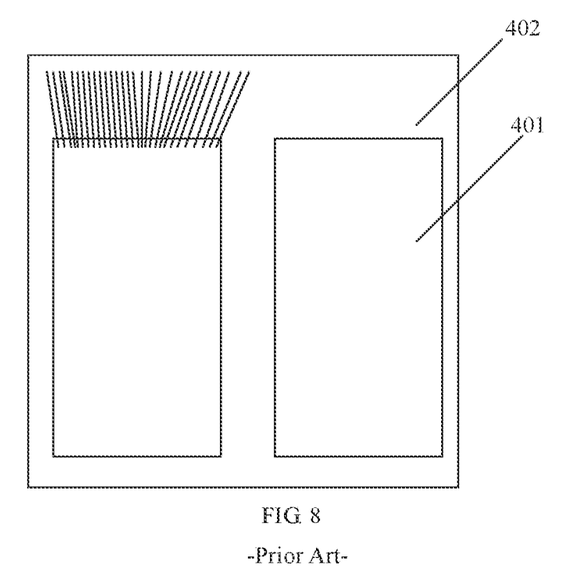
FIG. 8 schematically illustrates a schematic diagram of connection between another chip and a substrate in the related technologies.

The more the stacked layers of the chip are, the longer a bonding wire from the chip to the substrate is, and the larger the space occupied is. Under the condition of limited package internal cavity space, the size of the chip, the number of pads connected on the substrate and the number of stacked layers are mutually restrictive. That is, the smaller the size of the chip is and the fewer the number of pads is, the more layers can be stacked. The chip as shown in FIG. 5 is smaller in size than the chip as shown in FIG. 6, and thus more layers can be stacked. The pads as shown in FIG. 7 are more than the pads as shown in FIG. 8, thus a connecting line from the chip to the substrate is longer and an angle is larger, and more space is taken up.

There are more pads and fewer stacked layers in a chip assembly, which is a technical problem to be solved urgently at present.

It is to be noted that the above information disclosed in this Background portion is only for the purpose of enhancing understanding of the background of the present disclosure, and thus it may include information which does not constitute the prior art known to those of ordinary skill in the art.

SUMMARY

An objective of embodiments of the present disclosure is to provide a chip assembly and a chip to solve, at least to a certain extent, problems of more pads and fewer stacked layers in an existing chip assembly.

Other features and advantages of the present disclosure will become apparent from the following detailed description, or will be obtained in part, by practice of the present disclosure.

According to a first aspect of the embodiments of the present disclosure, there is provided a chip assembly. The chip assembly includes a substrate and a first chip and a second chip stacked on an upper surface of the substrate, wherein the first chip is arranged above the second chip. At edges of first sides of the first chip and the second chip there is provided with a first pad pair including a first reference potential pad and a second reference potential pad. At edges of second sides of the first chip and the second chip there is provided with a second pad pair including the first reference potential pad and the second reference potential pad. The second pad pair is arranged between two adjacent functional units at an outermost side of the edge of the second side of the first chip or the second chip, and a lower edge of the second pad pair is not lower than lower edges of the two adjacent functional units. A differential between an orientation to the first side of the first chip and an orientation to the first side of the second chip is 180 degrees, and the first pad pair of the first chip is corresponding in position to the second pad pair of the second chip.

In some embodiments, the first reference potential is a positive electrode of a power source, and the second reference potential is a ground potential.

In some embodiments, the chip assembly further comprises a third chip and a fourth chip stacked, wherein the third chip and the fourth chip stacked being arranged side by side on the substrate together with the first chip and the second chip stacked.

In some embodiments, the upper surface of the substrate corresponding to the edges of the first side and the second side of the first chip is provided with a connecting finger.

In some embodiments, the first pad pair and the send pad pair are arranged on the upper surfaces of the first chip and the second chip.

In some embodiments, the first pad pair on and the second pad pair on the first chip and the second chip are coupled to the connecting fingers through a bonding wire.

In some embodiments, the first pad pair on the first side of the first chip is connected to the second pad pair on the second side of the first chip through a power source cable.

In some embodiments, each of the chip assemblies comprises a first chip and a second chip stacked and a third chip and a fourth chip stacked.

In some embodiments, the first chip comprises a peripheral logic control circuit and a memory cell array, and the peripheral logic control circuit being arranged on the first side of the first chip.

In some embodiments, other signal pad of the first chip except the first reference potential pad and the second reference potential pad are arranged at the edge of the first side of the first chip.

In some embodiments, the first reference potential pad of the first pad pair of the first chip corresponds in position to the first reference potential pad of the second pad pair of the second chip, and the second reference potential pad of the first pad pair of the first chip corresponds in position to the second reference potential pad of the second pad pair of the second chip.

According to a second aspect of the embodiments of the present disclosure, there is provided a chip. At an edge of a first side of the chip there is provided with a first pad pair comprising a first reference potential pad and a second reference potential pad. At the edge of a second side of the chip there is provided with a second pad pair comprising a first reference potential pad and the second reference potential pad. The second pad pair being arranged between two adjacent functional units at an outermost side of the edge of the second side of the chip, and a lower edge of the second pad pair is not lower than lower edges of the two adjacent functional units. After the chip is rotated by 180 degrees in a plane where the chip is located, the first pad pair on the first side of the chip after the rotation corresponds in position to the second pad pair on the second side of the chip before the rotation.

In some embodiments, the first reference potential pad of the first pad pair of the chip after the rotation corresponds in position to the first reference potential pad of the second pad pair of the chip before the rotation. The second reference potential pad of the first pad pair of the chip after the rotation corresponds in position to the second reference potential pad of the second pad pair of the chip before the rotation.

In some embodiments, the chip includes a dynamic random access memory chip, and the functional unit of the chip includes a memory cell array.

The technical solutions provided by the embodiments of the present disclosure may include following beneficial effects.

In the technical solutions provided by some embodiments of the present disclosure, pad pairs are respectively arranged on the first side and the second side of the first chip and the second chip, and the first pad pair of the first chip is corresponding in position to the second pad pair of the second chip, which can reduce the number of pads of the chip and reduce the number of bonding points corresponding to the pad pairs on the substrate, such that the number of stackable layers can be increased in a fixed package space. In addition, the second pad pair is arranged between two adjacent functional units at an outermost side of the edge of the second side of the first chip or the second chip, which can further save the space for the chip. In this way, the pads can be arranged at the second side of the chip without taking up edge space of the second side. It is to be understood that the above general description and the detailed description below are merely exemplary and explanatory, and do not limit the present disclosure.

In the drawings: another signal pad 101; power source/ground pad 102; peripheral logic control circuit 103; memory cell array 104; chip 401; substrate 402; first pad pair 901; second pad pair 902; power source cable 903; first chip 1101; second chip 1102; connecting finger 1103; connecting finger 1104; power source positive pad 1105; ground potential pad 1106; bonding wire 1107.

DETAILED DESCRIPTION

Exemplary embodiments will be described more comprehensively by referring to the accompanying drawings now. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and their detailed description will be omitted.

In the related technologies, in the same package internal cavity space, the more pads of a chip of a chip assembly are, the fewer stackable layers of the chip are, which in turn affects functions of the chip assembly.

To solve the above-mentioned problem, the embodiments of the present disclosure provide a chip assembly to reduce the number of pads of the chip to increase the number of stackable layers in a fixed package space.

Figure 9:
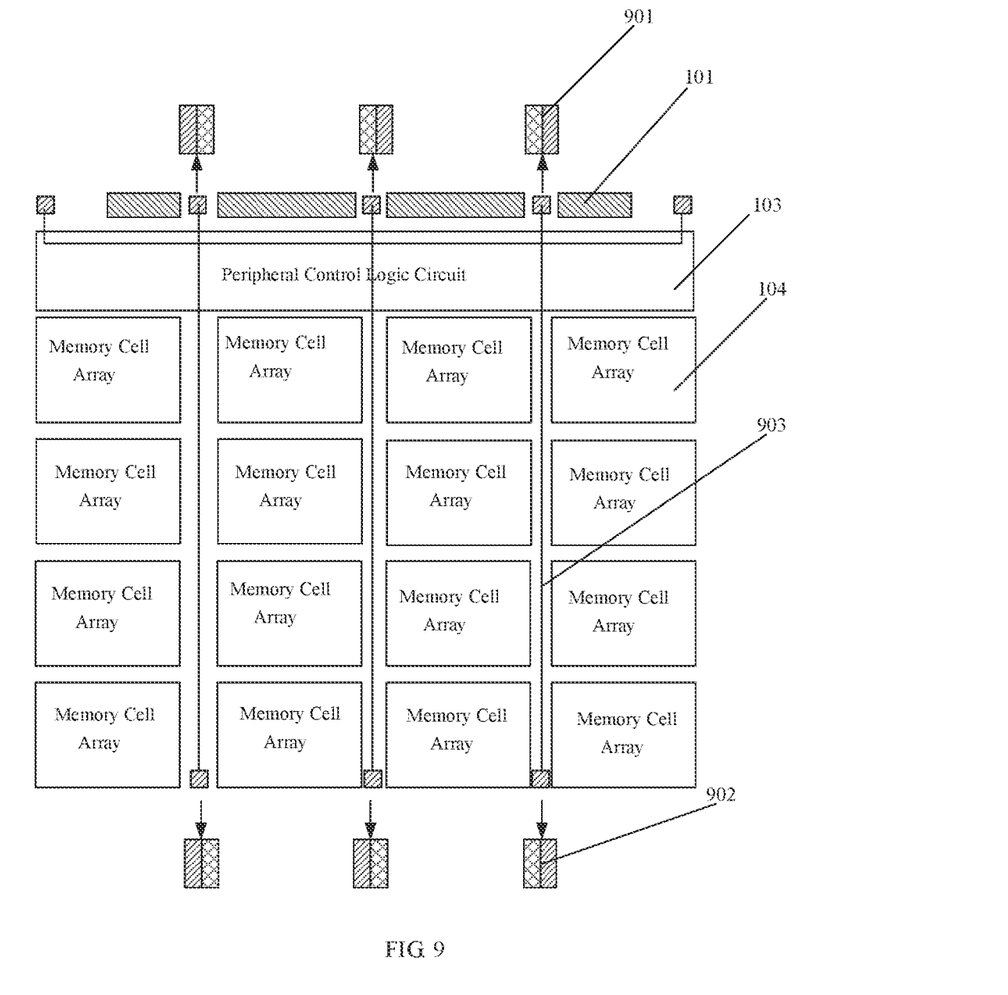
FIG. 9 schematically illustrates a schematic structural diagram of a chip according to an embodiment of the present disclosure.

FIG. 9 schematically illustrates a schematic structural diagram of a chip according to an embodiment of the present disclosure.

As shown in FIG. 9, in the chip provided by the embodiments of the present disclosure, at an edge of a first side of the chip there is provided with a first pad pair 901 including a first reference potential pad and a second reference potential pad. At the edge of a second side of the chip there is provided with a second pad pair 902 including the first reference potential pad and the second reference potential pad. The second pad pair 902 is arranged between two adjacent functional units at an outermost side of the edge of the second side of the chip, and a lower edge of the second pad pair 902 is not lower than lower edges of the two adjacent functional units. After the chip is rotated by 180 degrees in a plane where the chip is, the pad pair on the first side of the chip after the rotation is corresponding in position to the pad pair on the second side of the chip before the rotation.

In this way, the first reference potential pad of the first pad pair of the chip after the rotation is corresponding in position to the first reference potential pad of the second pad pair of the chip before the rotation, and the second reference potential pad of the first pad pair of the chip after the rotation is corresponding in position to the second reference potential pad of the second pad pair of the chip before the rotation.

Figure 10:
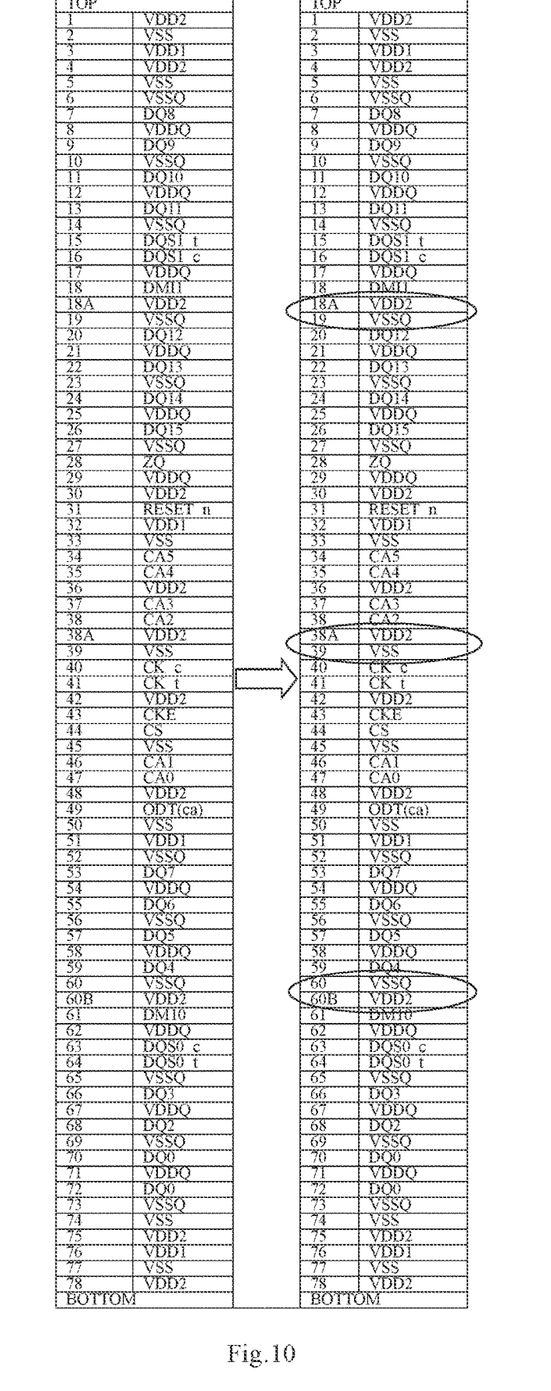
FIG. 10 schematically illustrates a schematic diagram showing variation of pad pins according to an embodiment of the present disclosure.

Here, the chip may be a dynamic random access memory chip, and the functional unit may be the memory cell array 104. The first reference potential may be a positive electrode of a power source, and the second reference potential may be a ground potential. As shown in FIG. 10, according to a pad order recommended by Joint Electron Device Engineering Council Solid State Technology Association (JEDEC) and according to an arrangement position of the memory cell array 104, an appropriate VSSQ (digital I/O port ground) and VQQ (digital ground) such as a pad 19, a pad 39 and a pad 60 are selected, and power source positive (VDD2) pads such as a pad 18A, a pad 38A and a pad 60B are additionally provided beside these pads VSSQ and VQQ. The additionally provided power source positive (VDD2) pads and the adjacent ground potential pads constitute a pad pair, i.e., a power source/ground pair to facilitate a remote pad distribution design. Here, the VSSQ and the VSS actually are short-circuited. In other words, they are the same node.

The exemplary embodiments of the present disclosure provide a chip assembly, which includes: a substrate and a first chip and a second chip stacked on an upper surface of the substrate, wherein the first chip is arranged above the second chip. Here, the first chip is the chip as shown in FIG. 9.

As shown in FIG. 9, at the edge of the first side of the chip there is provided with the first pad pair 901 including the first reference potential pad and the second reference potential pad. At the edge of the second side of the first chip there is provided with the second pad pair 902 including the first reference potential pad and the second reference potential pad. The second pad pair 902 is arranged between two adjacent functional units at an outermost side of the edge of the second side of the first chip, and the lower edge of the second pad pair 902 is not lower than the lower edges of the two adjacent functional units. At the edge of the first side of the second chip there is provided with the first pad pair including the first reference potential pad and the second reference potential pad. At the edge of the second side of the second chip there is provided with the second pad pair including the first reference potential pad and the second reference potential pad. The second pad pair is arranged between two adjacent functional units at the outermost side of the edge of the second side of the second chip, and the lower edge of the second pad pair is not lower than the lower edges of the two adjacent functional units. A differential between an orientation to the first side of the first chip and an orientation to the first side of the second chip is 180 degrees, and the first pad pair of the first chip is corresponding in position to the second pad pair of the second chip.

According to the technical solutions provided by the embodiments of the present disclosure, pad pairs are provided at the edges of the first side and the second side of the first chip and the second chip, and the first pad pair of the first chip is corresponding in position to the second pad pair of the second chip. In this way, when the pad pairs are bonded to connecting fingers on the substrate, one pad on the first side of the first chip and one pad on the second side of the second chip can correspond to the same connecting finger, such that the number of connecting fingers can be reduced.

In addition, the second pad pair is positioned between the two adjacent functional units on the outermost side at the edge of the second side of the first chip or the second chip, which may save the space at the edge of the second side of the chip. In comprehensive consideration of various factors such as package feasibility, power source/ground pad layout, wiring resources and utilization ratio, distribution of modules in the chip, chip area and fabrication costs, what is provided by the present disclosure is a new power source/ ground pad arrangement mode, which can reduce equivalent resistance of a power source/ground cable and improve high-frequency performances of the chip without increasing the area.

In the embodiments of the present disclosure, the first reference potential pad of the first pad pair of the first chip is corresponding in position to the first reference potential pad of the second pad pair of the second chip; and the second reference potential pad of the first pad pair of the first chip is corresponding in position to the second reference potential pad of the second pad pair of the second chip.

As shown in FIG. 9, three sets of pad pairs are arranged on the first side of the first chip. The left pad of the first pad pair from left to right is the power source positive pad, and the right pad is a ground potential pad. The left pads of the second pad pair and the third pad pair from left to right are the ground potential pads, and the right pads are the power source positive pads. Three sets of pad pairs are arranged on the second side of the first chip. The left pads of the first pad pair and the second pad pair from left to right are the power source positive pads, and the right pads are the ground potential pads. The left pad of the third pad pair from left to right is the ground potential pad, and the right pad is the power source positive pad. The second chip may have the same structure as the first chip.

In this way, when the first pad pair of the first chip is corresponding in position to the second pad pair of the second chip, the three sets of power source/ground pads on the first side of the first chip above coincide in position with the power source/ground pads on the second side of the second chip below, and thus it is not required for additional area to place the pads, and also it is not required for providing additional connecting fingers on the substrate for connection in the process of packaging.

In addition, some of logic circuits such as decoding logic circuits between the memory cell arrays 104 are used as up-and-down connection. Because there is no connecting line below the memory cell array at the bottom, some logic circuits may be simplified or even deleted, and the power source/ground pads may be placed in vacant positions. Thus, the second pad pair may be arranged between two adjacent functional units at an outermost side of the edge of the second side of the first chip or the second chip to reduce the area of the chip.

As shown in FIG. 9, the pad pair on the first side of the first chip is connected to the pad pair on the second side of the first chip through a power source cable 903. The first chip includes a peripheral logic control circuit 103 and the memory cell array 104, and the peripheral logic control circuit 103 is arranged on the first side of the first chip. Another signal pad of the first chip except the first reference potential pad and the second reference potential pad is arranged at the edge of the first side of the first chip. Here, the other signal pad includes a data input/output port pad, a command address port pad, and a clock port pad.

In the embodiments of the present disclosure, the chip assembly further includes a third chip and a fourth chip stacked. A stacked assembly formed by the first chip and the second chip and a stacked assembly formed by the third chip and the fourth chip are arranged side by side on the substrate.

Figure 11:
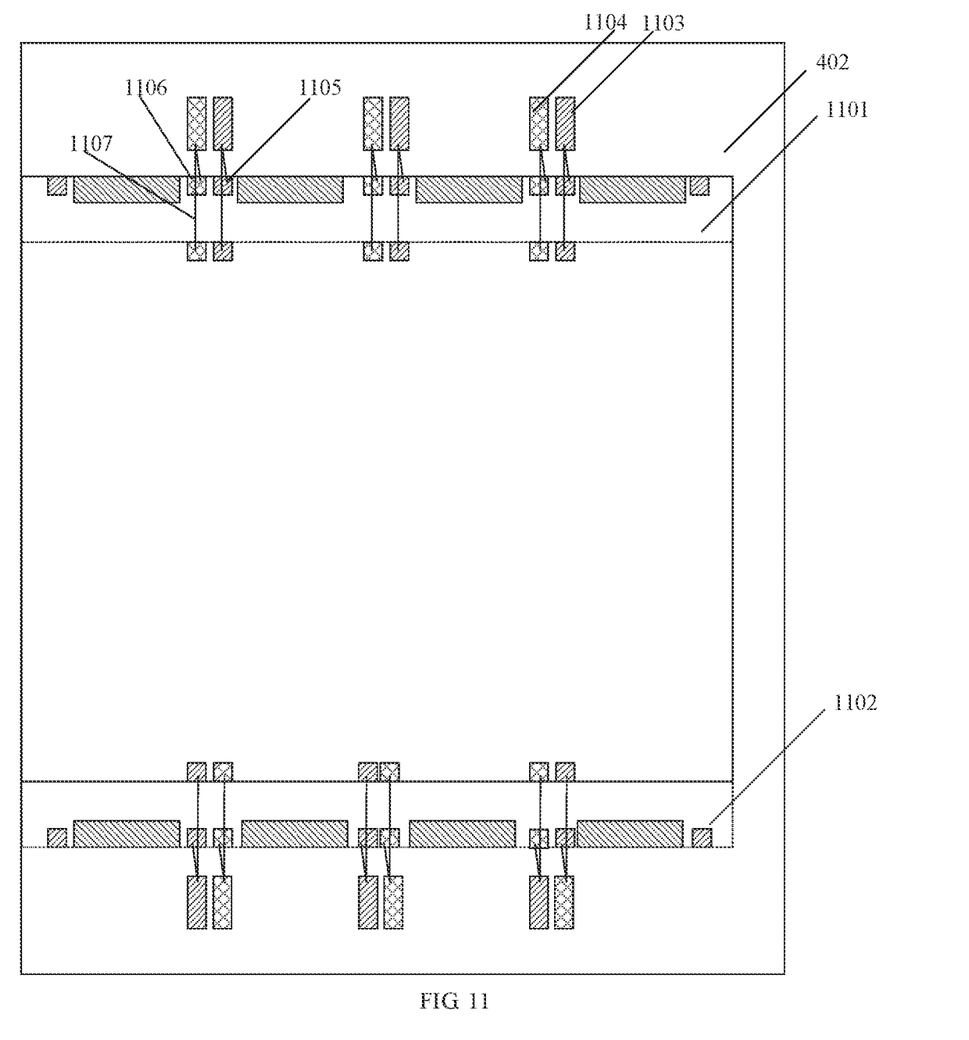
FIG. 11 schematically illustrates a schematic structural diagram of a chip assembly according to an embodiment of the present disclosure.

As shown in FIG. 11, the number of chips in the stacked assembly formed by the first chip and the second chip on the substrate is two. However, in practical applications, the number of chips in the stacked assembly formed by the first chip and the second chip is not limited thereto. Similarly, the number of chips in the stacked assembly formed by the third chip and the fourth chip may be two or more. For example, in one embodiment, each chip assembly includes the first chip and the second chip stacked and the third chip and the fourth chip stacked.

As shown in FIG. 11, the first chip 1101 and the second chip 1102 are stacked on a substrate 402. A power source positive pad 1105 and a ground potential pad 1106 are respectively coupled to a connecting finger 1103 and a connecting finger 1104 through a bonding wire 1107. In the embodiments of the present disclosure, on the upper surface of the substrate corresponding to the edges of the first side and the second side of the first chip there is provided with a connecting finger. The connecting finger is arranged on the upper surface of the substrate, and the pad pairs may also be arranged on the upper surfaces of the edges of the first side and the second side of the first chip and the second chip.

Similarly, the pad pairs may also be arranged on the upper surfaces of the third chip and the fourth chip. The pad pairs on the third chip and the fourth chip may also be coupled to the connecting fingers through the bonding wires. Here, the pad pair may include the power source positive pad 1105 and the ground potential pad 1106.

In the chip assembly provided by the embodiments of the present disclosure, pad pairs are respectively arranged on the first side and the second side of the first chip and the second chip, and the first pad pair of the first chip is corresponding in position to the second pad pair of the second chip, which can reduce the number of pads of the chip and reduce the number of bonding points corresponding to the pad pairs on the substrate, such that the number of stackable layers can be increased in a fixed package space. In addition, the second pad pair is arranged between two adjacent functional units at an outermost side of the edge of the second side of the first chip or the second chip, which can further save the space for the chip. In this way, the pads can be arranged at the second side of the chip without taking up edge space of the second side.

Although this specification uses relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a", "the", "said", and "at least one" are intended to mean that there exists one or more elements/constituent parts/etc. The terms "comprising" and "having" are intended to be inclusive and mean that there may be additional elements/constituent parts/etc. other than the listed elements/constituent parts/etc.

Other embodiments of the present disclosure will be apparent to those skilled in the art from consideration of the specification and practice of the invention disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A chip assembly, comprising: a substrate, a first chip and a second chip stacked on an upper surface of the substrate, wherein the first chip is arranged above the second chip; wherein a first pad pair comprising a first reference potential pad and a second reference potential pad are provided at edges of first sides of the first chip and the second chip, and a second pad pair comprising a first reference potential pad and a second reference potential pad are provided at edges of second sides of the first chip and the second chip;

the second pad pair is arranged between two adjacent functional units at an outermost side of the edge of the second side of the first chip or the second chip, and a lower edge of the second pad pair is not lower than lower edges of the two adjacent functional units; and a differential between an orientation to the first side of the first chip and an orientation to the first side of the second chip is 180 degrees, and the first pad pair of the first chip corresponds in position to the second pad pair of the second chip.

2. The chip assembly according to claim 1, wherein a first reference potential is a positive electrode of a power source, and a second reference potential is a ground potential.

3. The chip assembly according to claim 1, wherein the chip assembly further comprises a third chip and a fourth chip stacked, the third chip and the fourth chip stacked being arranged side by side on the substrate together with the first chip and the second chip stacked.

4. The chip assembly according to claim 3, wherein the upper surface of the substrate corresponding to the edges of the first side and the second side of the first chip is provided with connecting fingers.

5. The chip assembly according to claim 4, wherein the first pad pair and the second pad pair are arranged on the upper surfaces of the first chip and the second chip.

6. The chip assembly according to claim 4, wherein the first pad pair and the second pad pair on the first chip and the second chip are coupled to the connecting fingers through a bonding wire.

7. The chip assembly according to claim 1, wherein the first pad pair on the first side of the first chip is connected to the second pad pair on the second side of the first chip through a power source cable.

8. The chip assembly according to claim 1, wherein each of the chip assemblies comprises a first chip and a second chip stacked, and a third chip and a fourth chip stacked.

9. The chip assembly according to claim 1, wherein the first chip comprises a peripheral logic control circuit and a memory cell array, the peripheral logic control circuit being arranged on the first side of the first chip.

10. The chip assembly according to claim 1, wherein other signal pads of the first chip except the first reference potential pad and the second reference potential pad are arranged at the edge of the first side of the first chip.

11. The chip assembly according to claim 1, wherein the first reference potential pad of the first pad pair of the first chip corresponds in position to the first reference potential pad of the second pad pair of the second chip, and the second reference potential pad of the first pad pair of the first chip corresponds in position to the second reference potential pad of the second pad pair of the second chip.

12. A chip, wherein at an edge of a first side of the chip there is provided with a first pad pair comprising a first reference potential pad and a second reference potential pad, at an edge of a second side of the chip there is provided with a second pad pair comprising a first reference potential pad and a second reference potential pad, the second pad pair being arranged between two adjacent functional units at an outermost side of the edge of the second side of the chip, and a lower edge of the second pad pair being not lower than lower edges of the two adjacent functional units;

wherein after the chip is rotated by 180 degrees in a plane where the chip is located, the first pad pair on the first side of the chip after the rotation corresponds in position to the second pad pair on the second side of the chip before the rotation.

13. The chip according to claim 12, wherein the first reference potential pad of the first pad pair of the chip after the rotation corresponds in position to the first reference potential pad of the second pad pair of the chip before the rotation, and the second reference potential pad of the first pad pair of the chip after the rotation corresponds in position to the second reference potential pad of the second pad pair of the chip before the rotation.

14. The chip according to claim 12, comprising a dynamic random access memory chip, wherein the functional unit of the chip comprises a memory cell array.

\* \* \* \* \*